(12) United States Patent
Epler et al.

(10) Patent No.: US 8,174,025 B2
(45) Date of Patent: May 8, 2012

(54) SEMICONDUCTOR LIGHT EMITTING DEVICE INCLUDING POROUS LAYER

(75) Inventors: John E. Epler, Milpitas, CA (US); Michael R. Krames, Los Altos, CA (US); Hanmin Zhao, Fremont, CA (US); James C. Kim, San Jose, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 0 days.

(21) Appl. No.: 11/423,413

(22) Filed: Jun. 9, 2006

(65) Prior Publication Data

US 2007/0284607 A1 Dec. 13, 2007

(51) Int. Cl.
*H01L 27/15* (2006.01)

(52) U.S. Cl. ............ 257/79; 257/13; 257/94; 257/98; 257/103; 257/E33.043; 257/E33.067; 257/E33.068; 257/E33.074; 257/E51.021; 438/46

(58) Field of Classification Search ............... None
See application file for complete search history.

(56) References Cited

U.S. PATENT DOCUMENTS

| | | | |
|---|---|---|---|
| 5,376,580 A | | 12/1994 | Kish et al. |
| 5,405,786 A | * | 4/1995 | Kurtz .................. 438/53 |
| 5,625,202 A | * | 4/1997 | Chai .................. 257/94 |
| 5,644,156 A | * | 7/1997 | Suzuki et al. .................. 257/485 |
| 5,693,139 A | * | 12/1997 | Nishizawa et al. .................. 117/89 |
| 5,834,331 A | * | 11/1998 | Razeghi .................. 438/40 |
| 5,945,689 A | * | 8/1999 | Koike et al. .................. 257/88 |
| 6,015,719 A | | 1/2000 | Kish, Jr. |
| 6,072,197 A | * | 6/2000 | Horino et al. .................. 257/103 |
| 6,229,160 B1 | * | 5/2001 | Krames et al. .................. 257/94 |
| 6,512,248 B1 | * | 1/2003 | Takeuchi et al. .................. 257/81 |
| 6,809,340 B2 | * | 10/2004 | Kato et al. .................. 257/79 |
| 6,972,438 B2 | | 12/2005 | Li et al. |
| 2003/0209714 A1 | * | 11/2003 | Taskar et al. .................. 257/79 |
| 2004/0087056 A1 | | 5/2004 | Stalmans et al. |
| 2005/0041458 A1 | * | 2/2005 | Lossau et al. .................. 365/151 |
| 2005/0072968 A1 | | 4/2005 | Tsai et al. |
| 2005/0087760 A1 | | 4/2005 | Canham |
| 2005/0161696 A1 | * | 7/2005 | Yuri .................. 257/103 |
| 2005/0184299 A1 | * | 8/2005 | Matsumura et al. .................. 257/79 |
| 2005/0199891 A1 | * | 9/2005 | Kunisato et al. .................. 257/85 |
| 2005/0238075 A1 | * | 10/2005 | Jikutani et al. .................. 372/45.012 |
| 2005/0244098 A1 | | 11/2005 | Barrett |
| 2005/0253157 A1 | * | 11/2005 | Ohashi et al. .................. 257/95 |
| 2005/0285136 A1 | * | 12/2005 | Ou et al. .................. 257/103 |
| 2006/0049745 A1 | * | 3/2006 | Handa et al. .................. 313/503 |
| 2006/0056474 A1 | * | 3/2006 | Fujimoto et al. .................. 372/43.01 |
| 2006/0081832 A1 | * | 4/2006 | Chen .................. 257/13 |
| 2007/0018184 A1 | * | 1/2007 | Beeson et al. .................. 257/98 |

OTHER PUBLICATIONS

Eugene Hecht, Optics, 4th ediition.*

(Continued)

*Primary Examiner* — Fei Fei Yeung Lopez

(57) ABSTRACT

A light emitting device includes a semiconductor structure having a light emitting layer disposed between an n-type region and a p-type region. A porous region is disposed between the light emitting layer and a contact electrically connected to one of the n-type region and the p-type region. The porous region scatters light away from the absorbing contact, which may improve light extraction from the device. In some embodiments the porous region is an n-type semiconductor material such as GaN or GaP.

36 Claims, 5 Drawing Sheets

```
              Contact 46
         ┌──────────────────┐
        /   Thick Region 38  \
       /──────────────────────\
      /    P-type Region 36    \
     /──────────────────────────\
    /     Active Region 34       \
   /──────────────────────────────\
  /      N-type Region 32           \
 /──────────────────────────────────\
/        Porous Region 40             \
────────────────────────────────────────
              Contact 44
```

OTHER PUBLICATIONS

David L. Keune et al., "Monolithic GaP Green-Emitting LED Matrix-Addressable Arrays," IEEE Transactions on Electron Devices, vol. Ed-20, No. 11, Nov. 1973, pp. 1074-1077.

Eli Yablonovitch et al., "Extreme Selectivity in the Lift-Off of Epitaxial GaAs Films," Appl. Phys. Lett. 51 (26), Dec. 28, 1987, American Institute of Physics, pp. 2222-2224.

* cited by examiner

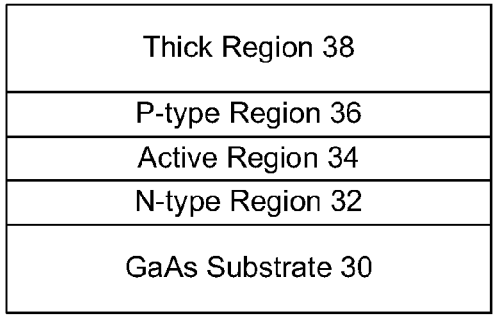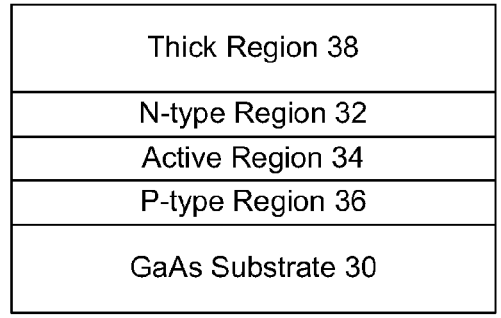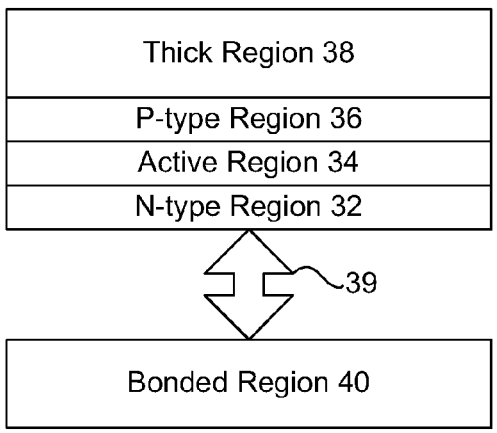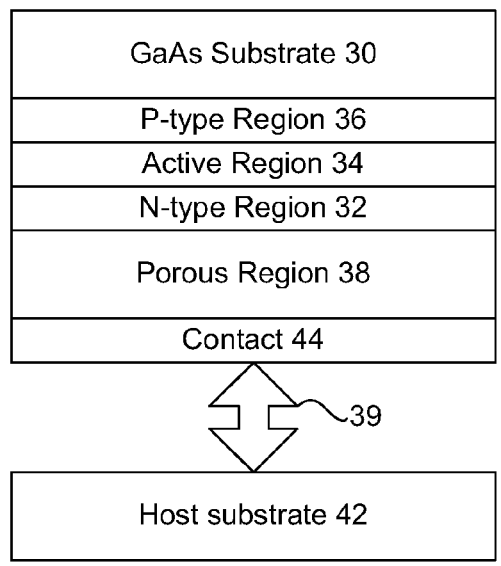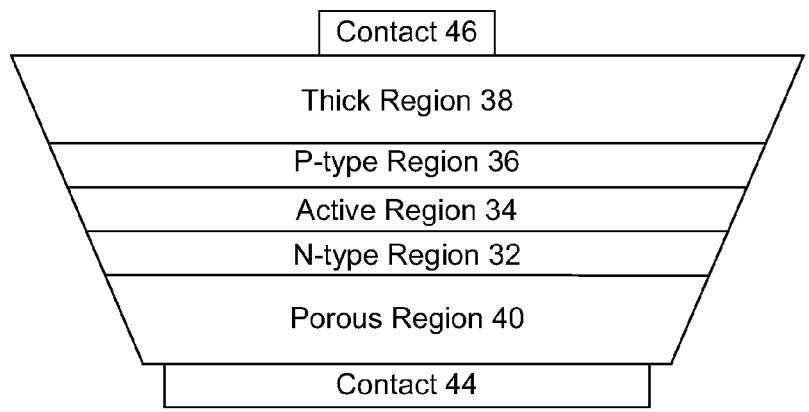

SEMICONDUCTOR LIGHT EMITTING DEVICE INCLUDING POROUS LAYER

BACKGROUND

1. Field of Invention

The invention relates to a semiconductor light emitting device, such as a light emitting diode, including a porous semiconductor layer.

2. Description of Related Art

Semiconductor light emitting devices such as light emitting diodes (LEDs) are among the most efficient light sources currently available. Material systems currently of interest in the manufacture of high brightness LEDs capable of operation across the visible spectrum include group III-V semiconductors, particularly binary, ternary, and quaternary alloys of gallium, aluminum, indium, and nitrogen, also referred to as III-nitride materials; and binary, ternary, and quaternary alloys of gallium, aluminum, indium, arsenic, and phosphorus. Often III-nitride devices are epitaxially grown on sapphire, silicon carbide, or III-nitride substrates and III-phosphide devices are epitaxially grown on gallium arsenide by metal organic chemical vapor deposition (MOCVD) molecular beam epitaxy (MBE) or other epitaxial techniques. Often, an n-type region is deposited on the substrate, then an active region is deposited on the n-type region, then a p-type region is deposited on the active region. The order of the layers may be reversed such that the p-type region is adjacent to the substrate.

Commercial LEDs are non-ideal devices that contain many optical loss mechanisms, both within the semiconductor layers, such as active layer re-absorption and free-carrier absorption, and at semiconductor-metal interfaces where highly-reflective effective ohmic contacts are difficult to realize. Light rays trapped by total internal reflection or waveguiding are particularly impacted by these mechanisms.

FIG. 1 illustrates a light emitting device described in more detail in U.S. Pat. No. 6,229,160, which is incorporated herein by reference. The LED of FIG. 1 includes a heterostructure comprising a plurality of p- and n-type doped epitaxial layers 10 grown on a substrate, e.g. GaAs, GaP, or sapphire. The p- and n-type layers are arranged to provide a p-n junction region in or near an active region 11. A transparent substrate or layer 12, a window for light extraction (and current spreading) is the top window layer for the device. Similarly, a window layer 13 for light extraction (and current spreading) may be attached to the epitaxial layers on the side opposite the top window layer by wafer-bonding, epitaxial growth, or regrowth, to become the bottom window layer. Top and bottom electrical ohmic contacts 14, 15 attached to the window layers allow injection of electrons and holes into the p-n junction region for recombination and the subsequent generation of light from the active region.

In order to increase extraction of light from the device, the sidewalls 16 of the primary window are oriented at an angle (or angles) β relative to the vertical direction such that the area extent of the top surface 17 is greater than that of the active device area. The sidewall makes an oblique angle with respect to the heterostructure. The angle β need not be constant as a function of device height (as shown in FIG. 1), but may vary continuously according to device height to result in either partially or wholly concave or convex sidewall shapes. The sidewall orientation causes light which strikes the sidewalls to be totally internally reflected into an escape cone at the top surface of the device, as shown by ray 18 in FIG. 1. Much of the light which is totally internally reflected at the top surface is redirected into an escape cone at the sidewalls, shown by ray 19.

Though the shaping of the device shown in FIG. 1 may increase light extraction, the device has several shortcomings. First, the efficiency of the device still suffers due to the inherent absorption of contacts 14 and 15. With a commonly-used full-sheet alloyed AuZn as back contact 15, light output is reduced due to poor reflectivity. Substituting a patterned AuZn back contact (with about 20% area coverage) in conjunction with reflective Ag-based die-attach epoxy may slightly increase light output. Second, the presence of one or more thick window layers in the device can be practically realized only by high temperature growth and processing steps which can compromise the quality of the semiconductor layers by redistributing defects and dopant atoms. Third, the thickness and the lateral extent of the structure must be scaled together to maintain the proper shape. Accordingly, shaped chips are not easily scalable and are not suitable for non-square footprints. The active region area is approximately one-half of the total lateral chip extent, resulting in a doubling of the current density in the active region, which may reduce internal efficiency at high operating temperatures and currents.

Needed in the art are techniques to improve light extraction.

SUMMARY

In accordance with embodiments of the invention, a light emitting device includes a semiconductor structure having a light emitting layer disposed between an n-type region and a p-type region. A porous region is disposed between the light emitting layer and a contact electrically connected to one of the n-type region and the p-type region. The porous region scatters light away from the absorbing contact, which may improve light extraction from the device. In some embodiments the porous region is an n-type semiconductor material such as GaN or GaP.

BRIEF DESCRIPTION OF THE DRAWINGS

FIG. 2 is a cross sectional view of device layers grown on a substrate.

FIG. 3 is a cross sectional view of the device of FIG. 2 bonded to a second structure.

FIG. 4 is a cross sectional view of a shaped device including a porous semiconductor region disposed between a contact and semiconductor device layers, with the contacts disposed on the top and bottom surfaces of the semiconductor structure.

FIG. 5 is a cross sectional view of device layers grown on a substrate.

FIG. 6 is a cross sectional view of the device of FIG. 5 bonded to a second structure.

DETAILED DESCRIPTION

In accordance with embodiments of the invention, a semiconductor light emitting device includes a scattering layer, such as a porous semiconductor layer. The scattering layer randomizes the direction of photons emitted from the device and is located to direct light away from absorbing structures, such as absorbing contacts, by acting as a diffuse reflector that scatters light toward desired emitting surfaces of the device, such as the top surface of the device, where a majority of light extracted from the device may be emitted. Though the devices described in the examples below generally include III-phosphide semiconductor layers grown on a GaAs substrate, in some embodiments III-nitride semiconductor layers may be used.

In some embodiments, the scattering layer is a porous GaP or other III-P layer. The porous layer is generally electrically and thermally conducting. The porous layer is often formed from an n-type layer, though after being made porous, the n-type porous layer may be converted to p-type conductivity, as described in some embodiments below. The amount of scattering is determined by the thickness and porosity of the porous layer. The porous layer generally has a thickness between 4 and 40 microns, though in some embodiments the entire n-doped substrate or binary epitaxial layer in the device may be made porous. The porous layer may have a porosity between 5% and 80% and often has a porosity between 20% and 40%. The porosity is limited on the lower end by the ability of the porous layer to scatter light and on the upper end by the resistivity and mechanical stability of the porous layer. Suitable porosity may be related to the thickness of the porous region. In order to provide the same amount of scattering, a thicker porous region may be less porous than a thinner porous region.

Figure 8:
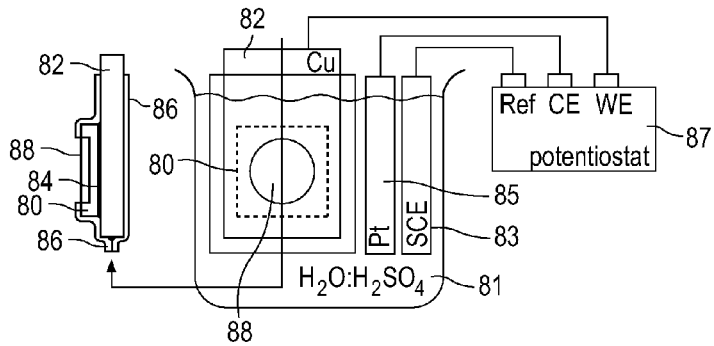
FIG. 8 illustrates an electrochemical anodic etching process for forming a porous semiconductor region.

A porous layer may be formed by a two step process. In the first step, the pores are created by an electrochemical anodic etch. In this step, the depth of the porous region is determined. In the second step, the pores are enlarged by a photochemical anodic etch until the desired porosity is reached. One example of an electrochemical anodic etching first step is illustrated in FIG. 8. The etched layer may be, for example, an n-type GaP single crystal layer with a donor density of $2\times10^{17}$ cm$^{-3}$. The wafer 80 is connected to a copper plate 82 by, for example, silver paste 84. A material such as Teflon 86 isolates the portion 88 of wafer 80 that is to be made porous. The wafer is exposed to a 0.5 M $H_2SO_4$ electrolye 81 as the working electrode in a standard electrochemical cell, with a Saturated Calomel Electrode (SCE) 83 as reference and a platinum counter electrode 85. The cell is controlled by a potentiostat 87. Application of a strong positive potential (15 V SCE) causes etching of submicron pits at surface defects, on the order of microns apart. These pits serve as the starting points for the etching of the sub-surface network of tunnel-like structures. The etching primarily occurs at the end of the tunnels such that the network grows deeper but the tunnels do not enlarge and merge. The amount of material removed is primarily a function of the time-integrated current density although the etchant solution, bias voltage, and substrate doping influence the pore density and size. The resulting depth of the porous structure is a function of all these variables. The lateral extent of the porous region may be controlled by masking nonporous area with for example SiN or photoresist before the etch.

In one example of a photochemical anodic etching second step, the electrochemically etched wafer is exposed to an $H_2O:H_2SO_4:H_2O_2$ electrolyte using 50 mW/cm$^2$ of sub-bandgap light from a Xe lamp, under an applied positive potential of 2 V SCE. The applied potential is too low for the above-described anodic etching process to take place and the sub-bandgap light is only absorbed at the electrolyte-semiconductor interface, so the primary effect is to increase the porosity of the layer defined in step one. The degree of porosity is determined by the time-integrated current density which is a function of light intensity, etchant concentrations and substrate parameters. Any suitable semiconductor material may be made porous by the process described above, such as Si, GaN, SiC, and GaP. Binary materials such as GaP and GaN are attractive candidates for porous regions, though ternary and quaternary III-phosphide and III-nitride materials may also be made porous. The conductivity type and dopant concentration in the semiconductor material may influence the characteristics of the porous layer, for example by influencing the size and spacing of the pores formed. In some embodiments, the porous region is formed from a layer that is not a p-type layer, i.e. a layer that is not intentionally doped or that is doped n-type layer with a dopant concentration between zero (not intentionally doped) and $10^{19}$ cm$^{-3}$.

FIGS. 2, 3, and 4 illustrate fabrication of one embodiment of the invention. In FIG. 2, an n-type region 32 including, for example, an n-AlInGaP layer is grown over an n-type GaAs or any other suitable substrate 30. A light emitting or active region 34 including, for example, a single AlInGaP light emitting layer or multiple AlInGaP quantum well layers separated by barrier layers, is grown over n-type region 32, followed by a p-type region 36 including, for example, a p-AlGaAs region. Each of n-type region 32, active region 34, and p-type region 36 may include multiple layers of different compositions and dopant concentration including, for example, layers of opposite conductivity type or layers that are not intentionally doped, preparation layers such as buffer layers or nucleation layers, release layers designed to facilitate later release of the growth substrate or thinning of the semiconductor structure after substrate removal, and device layers designed for particular optical or electrical properties desirable for the light emitting region to efficiently emit light. A thick region 38, which may be, for example, a thick p-type GaP region formed by vapor phase epitaxy, is grown on p-type region 36. Thick region 38 provides mechanical support to epitaxial layers 32, 34, and 36 so substrate 30 can be removed.

In FIG. 3, substrate 30, which may be an absorbing GaAs substrate, is removed and replaced by a transparent region 40 bonded 39 to the surface of n-type region 32 exposed by removal of substrate 30. Bonding is described in more detail in U.S. Pat. No. 5,376,580, which is incorporated herein by reference. Bonded region 40 may be, for example, an n-type GaP region. After bonding, as illustrated in FIG. 4 all or some part of region 40 may be made porous as described above. The device may be shaped as illustrated, and first and second contacts 46 and 44 are formed on the top and bottom surfaces of the device. Porous region 40 scatters any light directed toward the bottom of the device away from contact 44, where the light may otherwise be absorbed. The primary light extraction surfaces of the device is the top surface, (the top surface of thick region 38 in FIG. 4), on which contact 46 is formed, and the four side surfaces of the device. Other shapes are possible including a rectangular solid with vertical sidewalls or a truncated pyramid with sidewalls angled inward. Random or periodic surface texturing on top of region 38 and on the sides of the chip may be added to increase light extraction. In some embodiments, one or more sidewalls of the device are made porous.

Figure 1:
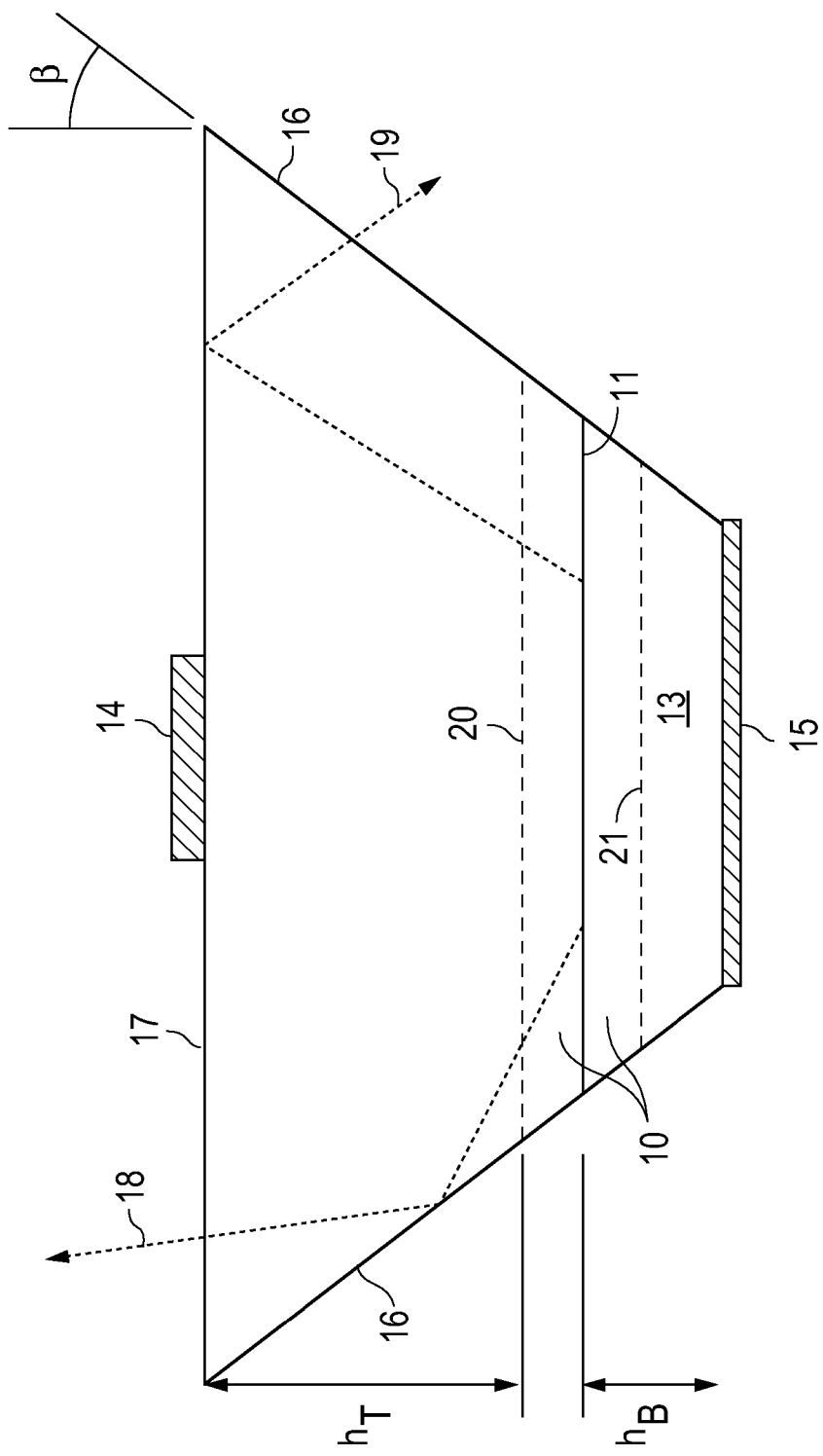
FIG. 1 is a cross sectional view of a semiconductor LED described in U.S. Pat. No. 6,229,160.
Figure 7:
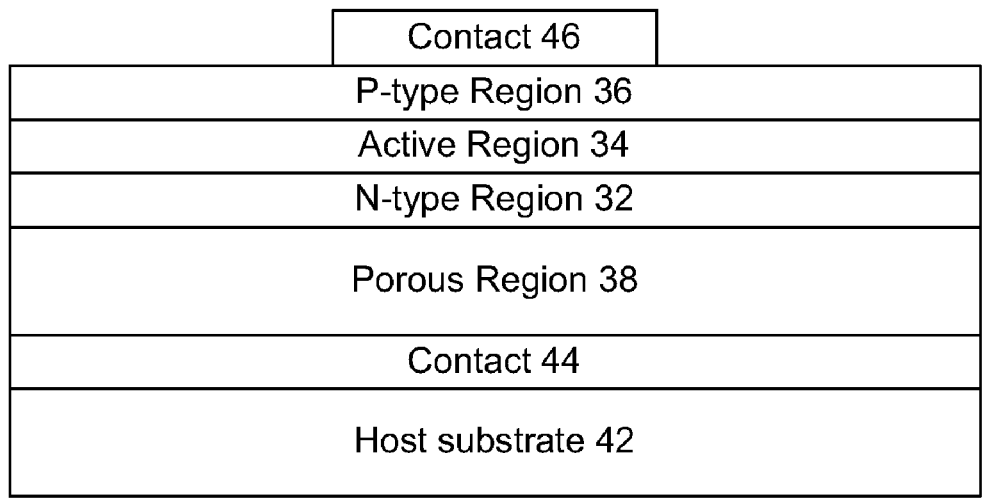
FIG. 7 is a cross sectional view of a shaped device including a porous semiconductor region disposed between a contact and semiconductor device layers, with the contacts both disposed on the bottom surface of the semiconductor structure.

FIGS. 5, 6, and 7 illustrate fabrication of another embodiment of the invention. As illustrated in FIG. 5, p-type region 36 is formed first on substrate 30, followed by active region 34 and n-type region 36. A thick n-type region 38 on the order of 15 microns thick is formed over n-type region 32. Part or all of region 38 is made porous as described above. A contact metal 44 is attached to region 38, as illustrated in FIG. 6. The semiconductor structure is then bonded to a host substrate 42 via contact 44. Substrate 30 is removed as illustrated in FIG. 7 and a second contact 46 is formed on the exposed surface of p-type region 36. The device illustrated in FIG. 7 avoids a high temperature wafer bonding step, such as that required to bond n-type region 32 to bonded region 40 in FIG. 3.

Figure 9:
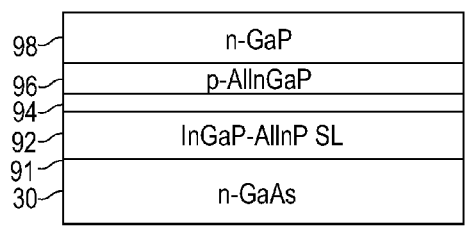
FIG. 9 is a cross sectional view of device layers grown on a substrate.
Figure 10:
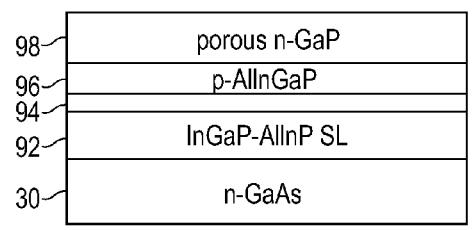
FIG. 10 is a cross sectional view of device layers grown on a substrate including a porous semiconductor region.

FIGS. 9, 10, 11, and 12 illustrate fabrication of another embodiment of the invention. In FIG. 9, device layers, including an n-type InGaP—AlInP superlattice or n-type AlGaAs layer 92, a light emitting region 94, a p-type AlInGaP layer 96, and a thick n-type GaP layer 98, are grown over a substrate 30. Thick n-type GaP region 98 is made porous in FIG. 10 by a process as described above. A layer 124 (FIG. 11) containing Zn, which may be, for example, AuZn, is formed over n-type porous GaP layer 98, then layer 98 is made p-type by heating the device such that Zn diffuses from layer 124 to layer 98. Alternatively, layer 98 may be made p-type by a vapor-phase process, where the device is placed in an ampoule containing Zn, then the ampoule is heated driving Zn from the vapor phase into layer 98. Alternatively, layer 98 may be made p-type by placing the device in a growth reactor and introducing a Zn source such as diethyl zinc, such that Zn dissociates from the Zn source and incorporates into layer 98.

Figure 11:
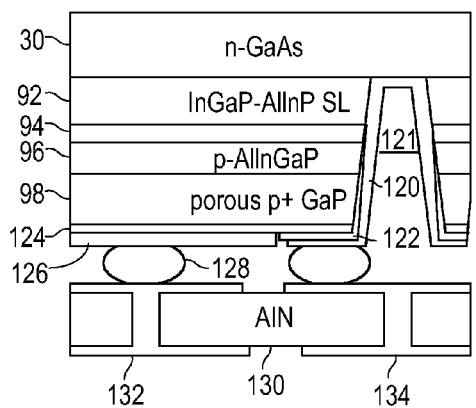
FIG. 11 is a cross sectional view of the device shown in FIG. 10 after forming contacts and mounting the device on a mount.

As illustrated in FIG. 11, a portion of porous region 98, p-type region 96, and active region 94 is removed to form a mesa 121 that exposes a portion of n-type region 92. In some embodiments, the interface 91 between substrate 30 and n-type region 92 acts as an etch-stop layer when mesa 121 is etched. A contact 120 is formed in mesa 121 for example by evaporating or plating. Contact 120 is electrically connected to n-type region 92 in the sides and/or bottom of mesa 121 and electrically isolated from p-type regions 96 and 98 by dielectric layer 122. A wafer of devices may be first diced into individual devices, then each device is flipped relative to the growth direction and mounted on a mount 130, in which case mount 130 may have a lateral extent larger than that of the device. Alternatively, a wafer of devices may be connected to a wafer of mounts, then diced into individual devices. Mount 130 may be, for example, semiconductor such as Si, metal, or ceramic such as AlN, and may have at least one metal pad 132 which electrically connect to the p-contacts 126 and at least one metal pad 134 which electrically connects to the n-contacts 120. Interconnects 128, which may be, for example, solder or gold stud bumps, connect the semiconductor device to mount 130.

Figure 12:
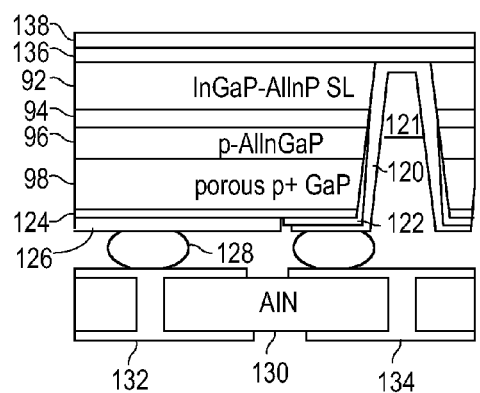
FIG. 12 is a cross sectional view of the device shown in FIG. 11 after removing the growth substrate and roughening the surface exposed by substrate removal.

In FIG. 12, substrate 30 is removed by a process suitable to the substrate material, such as etching. A rigid underfill may be provided between the device and mount 130 to support the semiconductor layers and prevent cracking during substrate removal. The top surface of n-type region 92 exposed by removing substrate 30 may be roughened 136, for example by an etching process such as photoelectrochemical etching or by a mechanical process such as grinding. Roughening the surface from which light is extracted may improve light extraction from the device. Alternatively, a photonic crystal structure may be formed in the top surface of n-type region 92 exposed by removing substrate 30. In some embodiments, a graded aluminum-containing layer is grown over a GaAs growth substrate. As the GaAs substrate is removed by etching, the etch rate varies with aluminum content as the etchant encounters the graded aluminum-containing layer, resulting in a rough surface. The growth substrate may thus be removed and the exposed surface roughened in a single etching step. In embodiments where the growth substrate is removed, the growth substrate may be removed on a wafer scale, such that the growth substrate is removed in one step from an entire wafer of devices, then the individual devices are diced after removal of the growth substrate. Alternatively, a wafer of devices may be diced into individual devices, the individual devices attached to another structure of arbitrary lateral extent, then the growth substrate removed from individual devices on a die scale.

In the embodiments described above, the porous region scatters light away from an absorbing contact. Because the amount of light that reaches the contact is reduced, the lateral extent of the absorbing contacts need not be limited, which may improve the electrical properties of the device and thereby improve performance. In addition, increasing the lateral extent of the contacts may compensate for any increase in resistance caused by the higher resistivity of the porous layer as compared to a nonporous layer of the same characteristics. In some embodiments, the porous region is located between the active region and the absorbing contact such that the surface of the porous region closest to the active region is spaced 0.1 to 0.4 microns from the active region, the porous layer serving to scatter light trapped within the waveguide. Some of the scattered light may be usefully extracted, contributing to the efficiency of the device. In some embodiments an optional wire grid polarizer 138 is formed over the top surface 136 of the device (FIG. 12), to reflect back into the chip the undesired polarization of the light while allowing light with the desired polarization to exit the chip. The porous layer may randomize the polarization of the backreflected light providing an increase in the output of light having the desired polarization. In some embodiments a transparent conductor such as indium tin oxide (ITO) may be formed over the top surface 136 to increase the current spreading across the chip. Removal of substrate 30 may expose parts of contact metal 120, providing a direct metal-ITO contact for improved conductivity.

Figure 13:
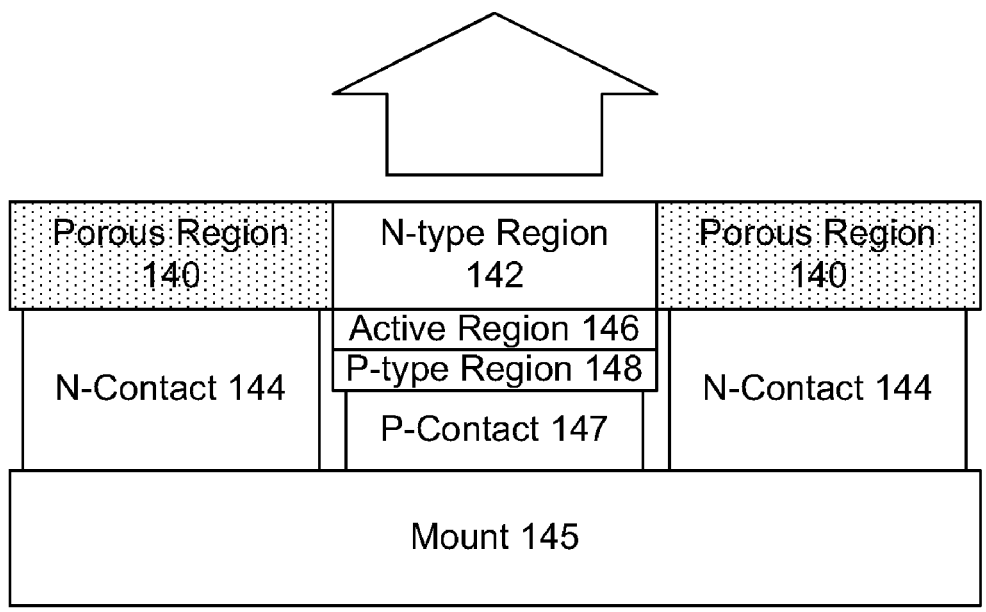
FIG. 13 is a cross sectional view of a spot emitter device including porous semiconductor regions.

Porous regions may also be used to confine light laterally within a chip. FIG. 13 is a cross sectional view of a spot emitter device including scattering layers. An n-type region including regions 140 and 142 is grown over a growth substrate, followed by an active region 146 and a p-type region 148. Portions of active region 146 and p-type region 148 are removed, so p- and n-contacts 147 and 144 may both be formed on the bottom surface of the device. The device is mounted on mount 145. The growth substrate (not shown) may be removed. Portions 140 of the n-type region are made porous as described above. Current spreads from n-contacts 144 through porous regions 140 and n-type region 142 to active region 146. Porous regions 140 scatter any light into the nonporous area of n-type region 142, such that any light emitting from the device is emitted from the surface corresponding to n-type region 142. Porous regions 140 thus confine the light to a small emission region, desirably creating a small source size. N-type region 142, active region 146, and p-type region 148 may be III-phosphide or III-nitride layers.

In some embodiments, wavelength converting layers such as phosphors and/or secondary optics such as dichroics or polarizers may be applied onto surfaces of the device, as is known in the art.

Figure 14:
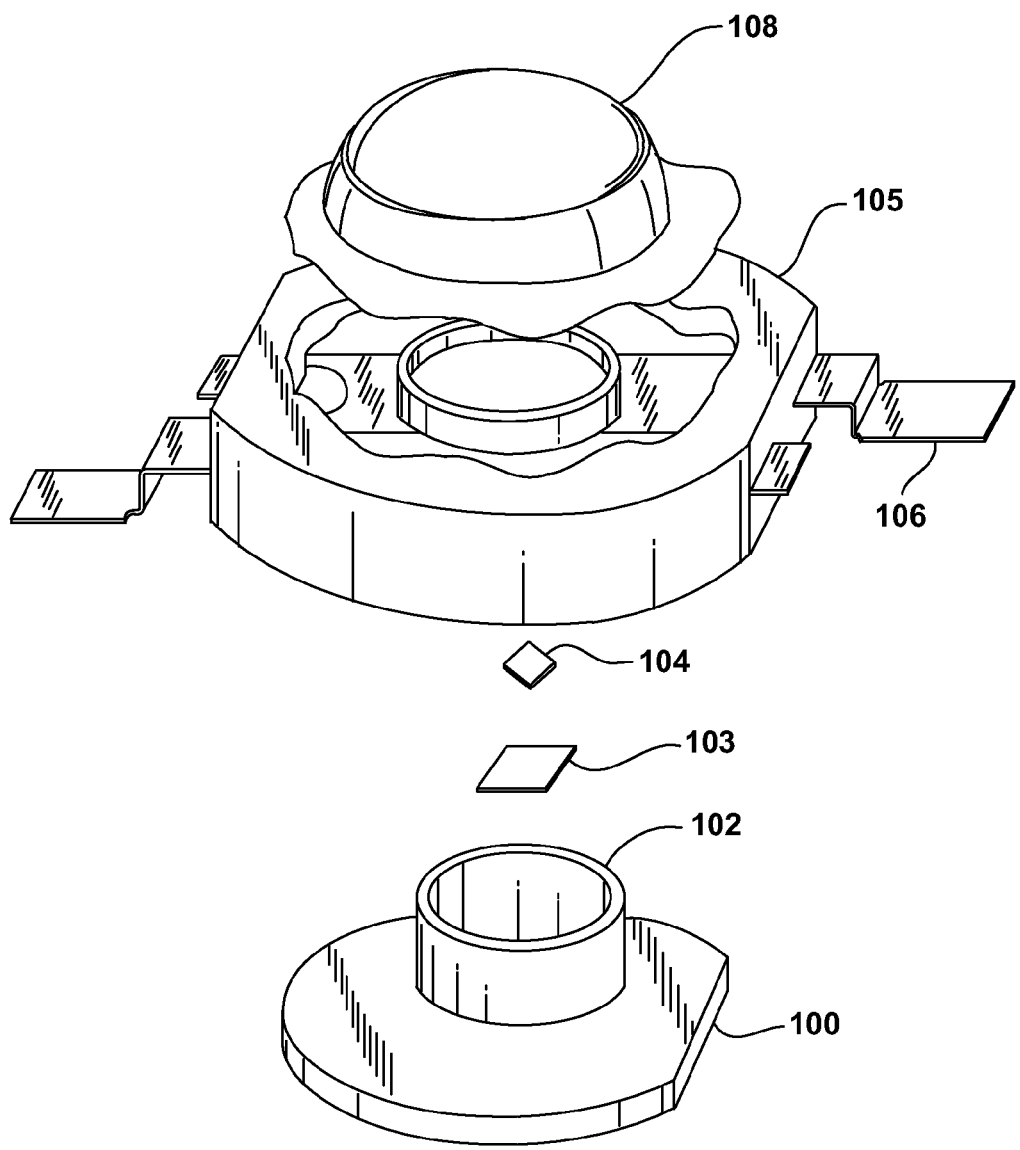
FIG. 14 is an exploded view of a package for a semiconductor light emitting device.

FIG. 14 is an exploded view of a packaged light emitting device, as described in more detail in U.S. Pat. No. 6,274,924. A heat-sinking slug 100 is placed into an insert-molded leadframe. The insert-molded leadframe is, for example, a filled plastic material 105 molded around a metal frame 106 that provides an electrical path. Slug 100 may include an optional reflector cup 102. The light emitting device die 104, which may be any of the devices described in the embodiments above, is mounted directly or indirectly via a thermally conducting submount 103 to slug 100. A cover 108, which may be an optical lens, may be added.

Having described the invention in detail, those skilled in the art will appreciate that, given the present disclosure, modifications may be made to the invention without departing from the spirit of the inventive concept described herein. For example, as described above, though the examples describe devices with III-phosphide semiconductor layers, embodiments of the invention may be implemented with III-nitride semiconductor layers, II-VI semiconductor layers, or semiconductor layers of any other suitable material system. In addition, though in the examples above given epitaxial structures are shown with particular contact arrangements, the epitaxial structures and contact arrangements are interchangeable and not limited to the particular implementations shown. Therefore, it is not intended that the scope of the invention be limited to the specific embodiments illustrated and described.

What is being claimed is:

1. A device comprising: a semiconductor structure including a light emitting element that includes a light emitting layer disposed between an n-type region and a p-type region; and a contact electrically connected to one of the n-type region and the p-type region; a porous semiconductor region disposed between the contact and the light emitting element, wherein at least a portion of the pores is disposed between the contact and the light emitting element such that the n-type region, the p-type region, and the light emitting layer are on one side of the porous semiconductor region and the contact is on an opposite side of the porous semiconductor region; and wherein the semiconductor structure further comprises a first surface from which light extracted from the semiconductor structure is emitted, wherein the light emitting layer is disposed between the first surface and the porous region.

2. The device of claim 1 wherein the porous region has a thickness between 4 and 40 microns.

3. The device of claim 1 wherein the porous region has a porosity between 5% and 80%, wherein the porosity is the percent volume of air in the porous region.

4. The device of claim 1 wherein the porous region has a porosity between 20% and 40%, wherein the porosity is the percent volume of air in the porous region.

5. The device of claim 1 wherein the porous region comprises an n-type region.

6. The device of claim 1 wherein the porous region comprises a p-type region.

7. The device of claim 1 wherein the porous region comprises GaP.

8. The device of claim 1 wherein a surface of the porous region closest to the light emitting layer is spaced 0.1 to 0.4 microns from the light emitting layer.

9. The device of claim 1 wherein the porous region is disposed between the n-type region and the contact that is connected to the n-type region.

10. The device of claim 9 wherein the contact is a first contact and the first contact is electrically connected to the n-type region on a second surface of the semiconductor structure, the device further comprising a second contact electrically connected to the p-type region on the first surface of the semiconductor structure.

11. The device of claim 1 wherein the porous region is disposed between the p-type region and the contact that is connected to the p-type region.

12. The device of claim 11 wherein the contact is a first contact and the first contact is electrically connected to the p-type region, the device further comprising a second contact electrically connected to the n-type region, wherein the first contact is disposed on a second surface of the semiconductor structure and at least a portion of the second contact is disposed in a trench formed in the semiconductor structure.

13. The device of claim 1 wherein the contact is a first contact, the device further comprising a second contact, wherein one of the first and second contacts is disposed on a second surface of the semiconductor structure and the other of the first and second contacts is disposed in a trench formed in the semiconductor structure.

14. The device of claim 13 further comprising a conductive material disposed over the first surface of the semiconductor structure.

15. The device of claim 14 wherein the conductive material comprises indium tin oxide.

16. The device of claim 13 further comprising a superlattice comprising alternating layers of AlInP and InGaP, wherein the superlattice is disposed between the light emitting layer and the first surface of the semiconductor structure.

17. The device of claim 1 wherein a side surface of the semiconductor structure is substantially perpendicular to the first surface of the semiconductor structure.

18. The device of claim 1 wherein a side surface of the semiconductor structure is oblique to the first surface of the semiconductor structure.

19. The device of claim 1 wherein a side surface of the semiconductor structure is porous.

20. The device of claim 1 further comprising a polarizer disposed on the first surface of the semiconductor structure.

21. A device comprising:
a semiconductor structure having a first surface, the semiconductor structure comprising a light emitting layer disposed between an n-type region and a p-type region; wherein:
a first portion of the first surface is a first surface of a porous region;
a second portion of the first surface is a first surface of a nonporous region; and
the second portion of the first surface is the surface from which a majority of light extracted from the semiconductor structure is emitted.

22. The device of claim 21 wherein a lateral extent of the light emitting layer corresponds to the second portion of the first surface.

23. The device of claim 21 wherein the porous region is GaN.

24. The device of claim 21 further comprising a metal contact disposed beneath the first region.

25. The device of claim 1 wherein the porous semiconductor region is arranged such that all light emitted from the light emitting layer in the direction of the contact strikes the porous semiconductor region before the contact.

26. A device comprising: a semiconductor structure including a light emitting layer disposed between an n-type region and a p-type region; and a contact electrically connected to one of the n-type region and the p-type region; a porous semiconductor region comprising GaP disposed between the contact and the light emitting layer, wherein at least a portion of pores of the porous region is disposed between the contact and the light emitting layer such that the n-type region, the p-type region, and the light emitting layer are on one side of the porous semiconductor region and the contact is on an opposite side of the porous semiconductor region; and wherein the semiconductor structure further comprises a first surface from which light extracted from the semiconductor structure is emitted, wherein the light emitting layer is disposed between the first surface and the porous region.

27. The device of claim 26 wherein the porous region has a thickness between 4 and 40 microns.

28. The device of claim 26 wherein the porous region has a porosity between 5% and 80%, wherein the porosity is the percent volume of air in the porous region.

29. The device of claim 26 wherein the porous region has a porosity between 20% and 40%, wherein the porosity is the percent volume of air in the porous region.

30. The device of claim 26 wherein the porous region comprises an n-type region.

31. The device of claim 26 wherein the porous region comprises a p-type region.

32. The device of claim 26 wherein the contact is a first contact, the device further comprising a second contact, wherein one of the first and second contacts is disposed on a second surface of the semiconductor structure and the other of the first and second contacts is disposed in a trench formed in the semiconductor structure.

33. The device of claim 26 wherein a side surface of the semiconductor structure is porous.

34. The device of claim 26 further comprising a polarizer disposed on the first surface of the semiconductor structure.

35. The device of claim 26 further comprising a superlattice comprising alternating layers of AlInP and InGaP, wherein the superlattice is disposed between the light emitting layer and the first surface of the semiconductor structure.

36. The device of claim 26 wherein a surface of the porous region closest to the light emitting layer is spaced 0.1 to 0.4 microns from the light emitting layer.

\* \* \* \* \*